US006271771B1

(12) United States Patent
Seitzer et al.

(10) Patent No.: US 6,271,771 B1
(45) Date of Patent: Aug. 7, 2001

(54) HEARING-ADAPTED QUALITY ASSESSMENT OF AUDIO SIGNALS

(75) Inventors: Dieter Seitzer, Erlangen; Thomas Sporer, Fürth, both of (DE)

(73) Assignee: Fraunhofer-Gesellschaft zur Förderung der Angewandten e.V. (DE)

( * ) Notice: Subject to any disclaimer, the term of this patent is extended or adjusted under 35 U.S.C. 154(b) by 0 days.

(21) Appl. No.: 09/308,082

(22) PCT Filed: Oct. 2, 1997

(86) PCT No.: PCT/EP97/05446

§ 371 Date: May 12, 1999

§ 102(e) Date: May 12, 1999

(87) PCT Pub. No.: WO98/23130

PCT Pub. Date: May 28, 1998

(30) Foreign Application Priority Data

Nov. 15, 1996 (DE) .............................................. 196 47 399

(51) Int. Cl.[7] .................................................... H03M 7/00

(52) U.S. Cl. ............................................................ 341/50

(58) Field of Search .............................. 341/50; 704/500, 704/222, 230

(56) References Cited

U.S. PATENT DOCUMENTS 4,009,035 7/1978 Yanick .
4,060,701 * 11/1977 Epley .................................... 73/599
4,508,940 4/1985 Steeger .
5,412,734 5/1995 Thomasson .

FOREIGN PATENT DOCUMENTS 42 22 050 1/1993 (DE) .
43 45 171A 3/1995 (DE) .
44 37 287C2 5/1996 (DE) .
0 473 367A1 3/1992 (EP) .
0 553 538A2 8/1993 (EP) .

OTHER PUBLICATIONS

Brandenburg et al., "NMR and Masking Flag: Evaluation of Quality Using perceptual Criteria", May 29–31, 1992, Portland, Oregan.

von E. Zwicker et al., "Zur Abhängigkeit der Nachverdeckung von der Störimpulsdauer" (no date given).

(List continued on next page.)

*Primary Examiner*—Brian Young
(74) *Attorney, Agent, or Firm*—Beyer Weaver & Thomas, LLP

(57) ABSTRACT

In a method for assessing the quality of an audio test signal derived from an audio reference signal by coding and decoding, the audio test signal is compared with the audio reference signal, as it were, behind the cochlea of the human ear. All masking effects as well as the transmission function of the ear are equally applied to the audio reference signal and the audio test signal. To this end, the audio test signal is broken down according to its spectral composition by means of a first bank of filters consisting of filters overlapping in frequency and defining spectral regions, said filters having differing filtering functions each determined on the basis of the excitation curve of the human ear with respect to the respective filter center frequency. The audio reference signal is also broken down according to its spectral composition into partial audio reference signals by means of a second bank of filters coinciding with the first bank of filters. Subsequently, a level difference by spectral regions is formed between the partial audio test signals and the partial audio reference signals belonging to the same spectral regions. To assess the quality of the audio test signal, a detection probability is determined, by spectral regions, on the basis of the respective level difference so as to detect a coding error of the audio test signal in the spectral region concerned.

23 Claims, 7 Drawing Sheets

OTHER PUBLICATIONS

Schroeder et al., "Optimizing Digital Speech Coders by Exploiting Masking Properties of the Human Ear", Dec. 1979, Acouiitcal Society of America.

J. Spille, "Messung der Vor–und Nachverdeckung bel Impulsen unter kritischen Bedingungen", Aug. 20, 1992, Thomson Consumer Electronics.

T. Sporer, "Evaluating Small Impairments with the Mean Opinion Scale–Reliable of Just a Guess?", Nov. 1996, AES.

Brandernurg, et al., "ISO–MPEG–1 Audio: A Generic Standard for Coding of High–quality Digital Audio", Oct. 1994, J. Audio Engineering Society.

* cited by examiner

HEARING-ADAPTED QUALITY ASSESSMENT OF AUDIO SIGNALS

FIELD OF THE INVENTION

The present invention relates to audio coding and decoding, respectively, and in particular to a method of and a device for performing a hearing-adapted quality assessment of audio signals.

BACKGROUND OF THE INVENTION AND PRIOR ART

As hearing-adapted digital coding methods have been standardized for some years (Kh. Brandenbrug and G. Stoll, The iso/mpeg-audio codec: A generic standard for coding of high quality digital audio, 92nd AES-Convention, Vienna, 1992, Preprint 3336), these are being employed in increasing manner. Examples hereof are the digital compact cassette (DCC), the minidisk, digital terrestrial broadcasting (DAB; DAB=Digital Audio Broadcasting) and the digital video disk (DVD). The disturbances known from analog transmissions as a rule are no longer present in digital uncoded audio signal transmission. Measurement technology can be confined to the transition from analog to digital and vice versa, if no coding of the audio signals is carried out.

In case of coding by means of hearing-adapted coding methods, however, audible artificial products or artifacts may occur that have not occurred in analog audio signal processing.

Known measurement values, such as e.g. the harmonic distortion factor or the signal-to-noise ratio, cannot be employed for hearing-adapted coding methods. Many hearing-adapted coded music signals have a signal-to-noise ratio of below 15 dB, without audible differences to the uncoded original signal being perceivable. In opposite manner, a signal-to-noise ratio of more than 40 dB may already lead to clearly audible disturbances.

In recent years, various hearing-adapted measuring methods were introduced, of which the NMR method (NMR=Noise to Mask Ratio) is to be mentioned (Kh. Brandenburg and Th. Sporer. "NMR" and "Masking Flag": Evaluation of quality using perceptual criteria. In *Proceedings of the* 11*th International Conference of the AES,* Portland, 1992).

In an implementation of the NMR method, a discrete Fourier transform of the length 1024 and using a Hann window with an advancing speed of 512 sampling values for an original signal and for a differential signal, is calculated between the original signal and a processed signal each. The spectral coefficients obtained therefrom are combined in frequency bands the width of which corresponds approximately to the frequency groups suggested by Zwicker in E. Zwicker, Psychoacoustics, publisher Springer-Verlag, Berlin Heidelberg N.Y., 1982, whereupon the energy density of each frequency band is determined. From the energy densities of the original signal, an actual masking or covering threshold is determined in consideration of the masking within the respective frequency group, the masking between the frequency groups and the post-masking for each frequency band, with said masking threshold being compared with the energy density of the differential signal. The resting threshold of the human ear is not fully considered since the input signals of the measuring method cannot be identified with fixed listening loudnesses, as a listener of audio signals usually has access to the loudness of the piece of music or audio piece he wants to listen to.

It has turned out that the NMR method, for example, in case of a typical sampling rate of 44.1 kHz, has a frequency resolution of about 43 Hz and a time resolution of about 23 ms. The frequency resolution is too low in case of low frequencies, whereas the time resolution is too low in case of high frequencies. Nevertheless, the NMR method displays a good reaction to many time effects. When a sequence of beats, such as e.g. drum beats, is sufficiently low, the block prior to the beat still has very low energy, so that a possibly occurring pre-echo can be recognized exactly. The advancing speed of 11.6 ms for the analysis window permits the recognition of many pre-echoes. However, when the analysis window has an unfavorable position, a pre-echo may remain unrecognized.

The difference between masking by tonal signals and by noise is not taken into consideration in the NMR method. The masking curves employed are empirical values obtained from subjective hearing tests. To this end, the frequency groups are located at fixed positions within the frequency spectrum, whereas the ear forms the frequency groups dynamically around particularly prominent sound events in the spectrum. Thus, more correct would be a dynamic arrangement about the centers of the energy densities. Due to the width of the fixed frequency groups, it is not possible to distinguish, for example, whether a sinusoidal signal is located in the center or at an edge of a frequency group. The masking curve thus is based on the most critical case, i.e. the lowest masking effect. The NMR method therefore sometimes indicates disturbances that cannot be heard by a human being.

The already mentioned low frequency resolution of only 43 Hz constitutes a limit to a hearing-adapted quality assessment of audio signals by means of the NMR method in particular in the lower frequency range. This has a particularly disadvantageous effect in the assessment of low-pitched voice signals, as produced for example by a male speaker, or sounds of very low-pitched instruments, such as e.g. a bass trombone.

For providing a better understanding of the present invention, some important psychoacoustic and cognitive fundamentals for the hearing-adapted quality assessment of audio signals will be indicated in the following. The most important term in the field of hearing-adapted coding and measuring technology is the term "Verdeckung"(=masking) which by analogy with the English term "masking" often is also referred to as "Maskierung". A discretely occurring, perceivable sound event of low loudness is masked by a louder sound event, i.e. it is no longer perceived in the presence of the second, louder sound event. The masking effect is dependent both upon the time structure and upon the spectral structure of the masker (i.e. the masking signal) and the masked signal.

FIG. 1 is to illustrate the masking of sounds by narrow-band noise signals 1, 2, 3 at 250 Hz, 1,000 Hz and 4,000 Hz and a sound pressure level of 60 dB. FIG. 1 is taken from E. Zwicker and H. Fastl, Concerning the dependency of post-masking on disturbance pulse duration, in *Acustica,* Vol. 26, pages 78 to 82, 1982.

The human ear in this respect can be regarded as a bank of filters consisting of a large number of mutually overlapping band-pass filters. The distribution of these filters over the frequency is not constant. In particular, with low frequencies the frequency resolution is clearly better than with high frequencies. When looking at the smallest perceivable frequency difference, this value is about 3 Hz at frequencies below about 500 Hz, and above 500 Hz increases in proportion to the frequency or center frequency of the frequency groups. When the smallest perceivable differences are juxtaposed on the frequency scale, 640 perceivable stages are obtained. A frequency scale that is adapted to the frequency sensation of human beings is constituted by the bark scale. The latter subdivides the entire audible range up to about 15.5 KHz into, 24 sections.

Due to the overlapping of filters of finite steepness, audio signals of low loudness in the vicinity of loud audio signals are masked. Thus, in FIG. 1 all sinusoidal audio signals present below the illustrated narrow-band noise curves 1, 2, 3, which in the spectrum are represented as an individual line, are masked and thereby are not audible.

The edge steepness of the individual masking filters of the bank of filters in the human ear, as assumed in the model, furthermore is dependent upon the sound pressure level of the signal heard and to a lesser extent on the center frequency of the respective band filter. The maximum masking is dependent upon the structure of the masker and is about −5 dB in case of masking by noise. In case of masking by sinusoidal sounds, the maximum masking is considerably lesser and, depending on the center frequency, is −14 to −35 dB (cf. in M. R. Schroeder, B. S. Atal and J. L. Hall, Optimizing digital speech coders by exploiting masking properties of the human ear, *The Journal of the Acoustic Society of America,* Vol. 66 (No. 6), pages 1647 to 1652, December 1979.

The second important effect is masking in terms of time, which is to be elucidated with the aid of FIG. 2. Immediately after, but also immediately prior to a loud sound event, sound events of lower loudness are not perceived. The masking in terms of time is highly dependent on the structure and the duration of the masker (cf. H. Fastl, Thresholds of masking as a measure for the resolution capacity of the human ear in terms of time and spectrum. Dissertation, faculty for mechanical and electrotechnical engineering of the Technical University of Munich, Munich, May 1974). Post-masking may have a duration of up to 100 ms in particular. The greatest sensitivity and thus the shortest masking effect occurs in the masking of noise by Gaussian pulses. With this, pre-masking and post-masking are only about 2 ms.

With a sufficiently great distance from the masker or from 4 in FIG. 1, the masking curves change into a resting threshold 5. At the beginning and at the end of a masking signal, the masking curves during pre-masking 6 and post-masking 7, respectively, change into simultaneous masking 8. FIG. 2 is taken in essence from E. Zwicker, Psychoacoustics, publisher Springer-Verlag, Berlin Heidelberg N.Y., 1982.

The pre-masking effect is explained by the different-velocity processing of signals on their way from the ear to the brain and in the brain, respectively. Large stimuli, i.e. sound events of great loudness or sound events with a high sound pressure level (SPL) are passed on faster than small ones. A loud sound event therefore, so to speak, can "take over" and thus mask a sound event of lower loudness preceding the same in time.

Post-masking corresponds to a "recovery time" of the sound receptors and the transmission of stimuli, in which in particular the decomposition of messenger substances at the nervous synapses would have to be indicated.

The masking extent or the degree of masking is dependent on the structure of the masker, i.e. the masking signal, both in terms of time and spectrum. Pre-masking is shortest (about 1.5 ms) with pulse-like maskers and considerably longer (up to 15 ms) in case of noise signals. After 100 ms, post-masking reaches the resting threshold. As regards the exact configuration of the post-masking curve, the literature makes different statements. Thus, in a particular case, post-masking in case of noise signals may differ between 15 to 40 ms. The values indicated hereinbefore each constitute minimum values for noise. New investigations with Gaussian pulses as maskers show that for such signals post-masking also takes place within a range of 1.5 ms (J. Spille, Measurement of pre- and post-masking in pulses under critical conditions, Internal Report, Thomson Consumer Electronics, Hannover, 1992). In case both maskers and disturbance signals are band-limited by means of a low-pass filter, both pre-masking and post-masking become longer.

Masking in time plays an important role in the assessment of audio coding methods. When the operation is of block-type, which holds for most cases, and when there are actions in the block, disturbances may possibly be caused prior to the action, which are above the level of the useful signal level. These disturbances possibly are masked by a pre-masking effect. However, in case such a disturbance is not masked, the effect arising is referred to as "pre-echo". Pre-echoes as a rule are not perceived separately from the action, but as a sound coloration of the action.

The resting threshold (4 in FIG. 1) results from the frequency response of external and middle ear and by the superimposition of the sound signals having reached the inner ear with the basic noise caused by the blood flow, for example. This basic noise and the resting threshold, which is not constant in the frequency range, thus mask sound events of very low loudness. FIG. 1 reveals in particular that a good sense of hearing may perceive a frequency range from 20 Hz to 18 kHz.

The subjectively perceived loudness of a signal is very much dependent on its spectral composition and its composition in time. Portions of a signal may mask other portions of the same signal, in such a manner that they no longer contribute to the hearing impression. Signals close to the listening threshold (i.e. signals that just are still perceivable) are perceived to be less loud than corresponds to their actual sound pressure level. This effect is referred to as "choking" (E. Zwicker and R. Feldtkeller, The ear as recipient of messages, publisher Hirzel-Verlag, Stuttgart, 1967).

Furthermore, there are cognitive effects playing a role in the assessment of audio signals. In particular, a five-stage so-called "impairment scale" (impairment=deterioration) has established itself. It is the task of human test persons to make, in a double blind test, assessments for two signals, one thereof being the original signal that has not been coded and decoded, whereas the other signal is a signal obtained after coding and subsequent decoding. The hearing test uses three stimuli A, B, C, in which signal A always is the reference signal. A person performing the hearing test always compares the signals B and C to A. In this respect, the uncoded signal is referred to as reference signal, whereas the signal derived by coding and decoding from the reference signal is referred to as test signal. In the assessment of clearly audible disturbances, there are thus not only psychoacoustic effects playing a role, but also cognitive or subjective effects.

In the assessment of audio signals by human listeners, cognitive effects have considerable influence on the assessment by means of the impairment scale. Discrete, very strong disturbances often are perceived by many test persons as less disturbing than permanently present disturbances. However, starting from a specific number of such strong disturbances, they dominate the quality impression. Systematic investigations in this respect are not known from the literature.

Although the perception thresholds of different listeners are hardly different in psychoacoustic tests, various artifacts are perceived by different test persons in differently grave manner. While some test persons perceive restrictions in bandwidth to be less disturbing than noise modulations at high frequencies, this is felt exactly in the opposite manner by other test persons.

The assessment scales of various test persons are clearly different from each other. Many listeners tend to rate clear audible disturbances as grade 1 ("very disturbing"), while they hardly assign average grades. Other listeners often assign average grades (Thomas Sporer, Evaluating small impairments with the mean opinion scale—reliable or just a guess? In 101*nd AES-Convention*, Los Angeles, 1996, Preprint).

DE 44 37 287 C2 discloses a method of measuring the maintenance of stereophonic audio signals and a method of recognizing commonly coded stereophonic audio signals. A signal to be tested, having two stereo channels, is formed by coding and subsequent decoding of a reference signal. Both the signal to be tested and the reference signal are transformed to the frequency range. For each partial band of the reference signal and for each partial band of the signal to be tested, signal characteristics are formed for the reference signal and for the signal to be tested. The signal characteristics belonging to the same partial band each are compared with each other. From this comparison, conclusions are made with respect to the maintenance of stereophonic audio signal properties or the disturbance of the stereo sound impression in the coding technique used. Subjective influences on the reference signal and the signal to be tested, due to the transmission properties of the human ear, are not taken into consideration in this publication.

DE 4345171 discloses a method of determining the coding type to be selected for coding at least two signals. A signal having two stereo channels is coded by intensity stereo coding and decoded again in order to be compared with the original stereo signal. The intensity stereo coding is to be used for audio coding proper of the stereo signal when the left-hand and right-hand channels are very similar to each other. The coded/decoded stereo signal and the original stereo signal are transformed from the time domain to the frequency domain by a transformation method with unlike time resolution and frequency resolution. This transformation method comprises a hybrid/polyphase filter bank through which similar spectral lines are generated, for example, by means of an FFT or MDCT. By selecting a scale factor bandwidth that increases as of a specific limit frequency, the frequency group width and the related time resolution of the human sense of hearing is to be simulated. Subsequently, the short-time energies are formed in the respective frequency group bands by squaring and summation both of the original stereo signal and of the coded/decoded stereo signal. The short-time energy values thus obtained are assessed using the psychoacoustic listening threshold in order to take only the audible short-time energy values into further consideration for considering the psychoacoustic masking effects in the assessment whether intensity stereo coding makes sense. This assessment of the short-time energy values of the frequency group bands can be extended, furthermore, by modelling of the human inner ear, so as to consider the non-linearites of the human inner ear as well.

SUMMARY OF THE INVENTION

It is the object of the present invention to provide a method of and a device for performing a hearing-adapted quality assessment of audio signals, which by way of an improved resolution in terms of time achieve enhanced modelling of the events in the human ear, so as to provide more independency of subjective influences.

In accordance with a first aspect of the invention, this object is achieved by a method of performing a hearing-adapted quality assessment of an audio test signal derived from an audio reference signal by coding and decoding, comprising the following steps: breaking down the audio test signal in accordance with its spectral composition into partial audio test signals by means of a first bank of filters consisting of filters overlapping in frequency and defining spectral regions, said filters having differing filter functions which are each determined on the basis of the excitation curves of the human ear at the respective filter center frequency, with an excitation curve of the human ear at a filter center frequency being dependent upon the sound pressure level of an audio signal supplied to the ear; breaking down the audio reference signal in accordance with its spectral composition into partial audio reference signals by means of a second bank of filters coinciding with the first bank of filters; forming the level difference, by spectral regions, between the partial audio test signals and the partial audio reference signals belonging to the same spectral regions; and determining, by spectral regions, a detection probability for detecting a coding error of the audio test signal in the particular spectral region on the basis of the respective level difference, the detection probability simulating the probability that a level difference between a partial audio reference signal and a partial audio test signal is sensed by the human brain.

In accordance with a second aspect of the invention, this object is achieved by a device for performing a hearing-adapted quality assessment of an audio test signal derived from an audio reference signal by coding and decoding, comprising: a first bank of filters for breaking down the audio test signal in accordance with its spectral composition into partial audio test signals, said first bank of filters including filters overlapping in frequency and defining spectral regions and having differing filter functions which are each determined on the basis of the excitation curves of the human ear at the respective filter center frequency, with an excitation curve of the human ear at a filter center frequency being dependent upon the sound pressure level of an audio signal supplied to the ear; a second bank of filters coinciding with the first bank of filters, for breaking down the audio reference signal in accordance with its spectral composition into partial audio reference signals; a calculating device for forming the level difference, by spectral regions, between the partial audio test signals and the partial audio reference signals belonging to the same spectral regions; and an allocation device for determining, by spectral regions, a detection probability for detecting a coding error of the audio test signal in the particular spectral region on the basis of the respective level difference, the detection probability simulating the probability that a level difference between a partial audio referene signal and a partial audio test signal is sensed by the human brain.

The invention is based on the realization to simulate all non-linear auditory effects equally on the reference signal and the test signal and to carry out a comparison for quality assessment of the test signal, as it were, behind the ear, i.e. at the transition from the cochlea to the auditory nerve. The hearing-adapted quality assessment of audio signals thus employs a comparison in the cochlear domain. The excitations in the ear by the test signal and the audio reference signal, respectively, are thus compared. To this end, both the audio reference signal and the audio test signal are broken down to their spectral compositions by a bank of filters. By means of a large number of filters overlapping in frequency, a sufficient resolution both in terms of time and in terms of frequency is ensured. The auditory effects of the ear are taken into consideration such that each individual filter has a configuration of its own which is determined by way of the external and middle ear transmission function and the internal noise of the ear, by way of the center frequency $f_m$ of a filter and by way of the sound pressure level L of the audio signal to be assessed. For reducing the complexity and the calculating expenditure, a worst-case consideration is carried out for each filter transmission function, whereby a so-called worst-case excitation curve for various sound pressure levels at the respective center frequency of each filter is determined for the same.

For further reduction of the calculating expenditure, parts of the bank of filters are calculated using a reduced sampling rate, thereby significantly reducing the data stream to be processed. For reasons of compatibility with fast Fourier transform or modifications thereof, as performed by the bank of filters, only such sampling rates are employed which are the result of the quotient of the original sampling rate and a power of two (i.e. ½, ¼, ⅛, 1/16, 1/32 times of the original sampling or data rate, respectively). In this manner, there is always obtained a uniform window length of the various filter groups operating with an identical sampling frequency.

Finally, each filter of the bank of filters has connected downstream thereof a modelling means for modelling pre- and post-masking. Modelling of pre- and post-masking reduces the necessary bandwidth to such an extent that, depending on the filter, a further reduction of the sampling rate, i.e. under-sampling, is rendered possible. In a preferred embodiment of the invention, the resulting sampling rate in all filters thus corresponds to 1/32 of the input data rate. This common sampling rate for all banks of filters is highly advantageous and necessary for further processing.

Subsequently to the bank of filters, the delay of the output signals of the individual filters is determined so as to compensate possibly existing unsynchronicites in calculating the audio test signal and the audio reference signal, respectively.

The comparison of the audio reference signal with the audio test signal, as mentioned, is carried out, as it were, "behind the cochlea". The level difference between an output signal of a filter of the bank of filters for the audio test signal and the output signal of the corresponding filter of the bank of filters for the audio reference signal is detected and mapped in a detection probability which takes into consideration whether a level difference is sufficiently large for being recognized as such by the brain. The hearing-adapted quality assessment according to the present invention permits a common evaluation of level differences of several adjacent filters in order to achieve a measure for a subjectively perceived disturbance in the bandwidth defined by the commonly evaluated filters. For obtaining a subjective impression matched to the ear, the bandwidth will be smaller than or equal to a psychoacoustic frequency group.

BRIEF DESCRIPTION OF THE DRAWINGS

Preferred embodiments of the present invention will be elucidated in more detail in the following with reference to the accompanying drawings in which

FIG. 5 shows a block diagram of a bank of filters according to

FIG. 4;

DETAILED DESCRIPTION OF PREFERRED EMBODIMENTS

Figure 1:
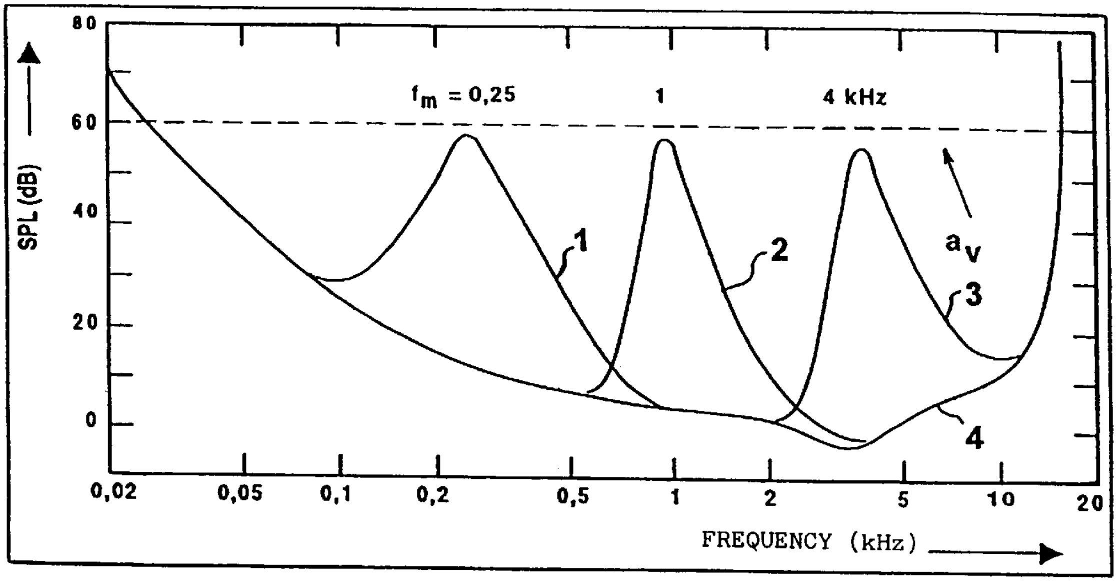
FIG. 1 shows an illustration of the masking of sounds by narrow-band noise signals at various frequencies.
Figure 2:
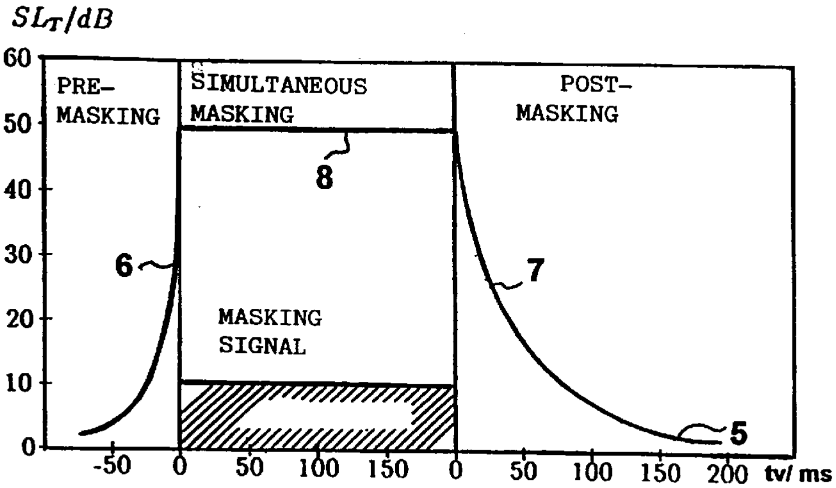
FIG. 2 shows the principle of masking in the time domain.
Figure 3:
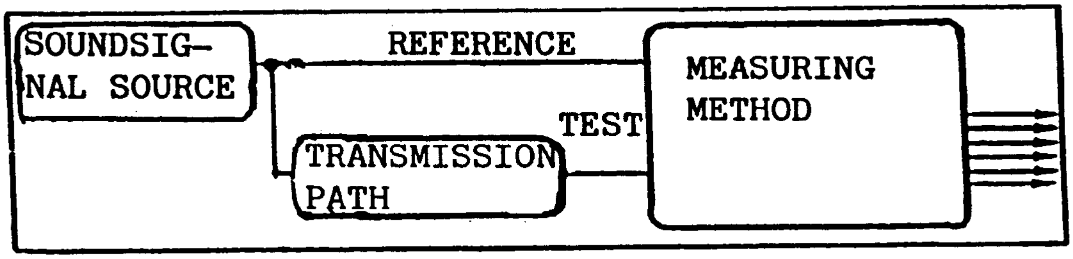
FIG. 3 shows a general block diagram of an audio measuring system.

FIG. 3 shows a general block diagram of an audio measuring system corresponding to the present invention in its basic outline. A measuring method is fed on the one hand with an unprocessed output signal of a sound signal source (reference) and on the other hand with a signal (test) to be assessed, which arrives from a transmission path, such as e.g. an audio coder/decoder means (or "audio codec"). The measuring method calculates therefrom various characteristics describing the quality of the test signal in comparison with the reference signal.

A basic idea of the method of assessing the quality of audio signals according to the invention consists in that an exactly hearing-adapted analysis is possible only when the resolutions in terms of time and spectrum are as high as possible at the same time. In case of all known measuring methods, either the resolution in time is very restricted by the use of a discrete Fourier transform (DFT) (block length as a rule 10.67 ms to 21.33 ms) or the spectral resolution was reduced too much due to a too small number of analysis channels. The method of assessing the quality of audio signals according to the invention provides a high number (241) of analysis channels along with a high resolution in time of 0.67 ms.

Figure 4:
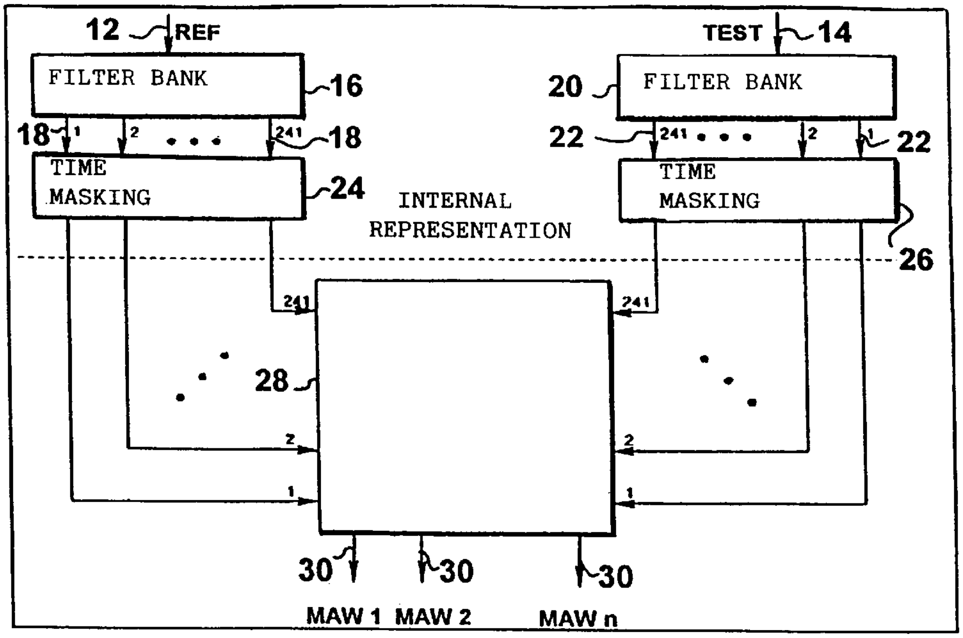
FIG. 4 shows a block diagram of the device for hearing-adapted quality assessment of audio signals according to the present invention.

FIG. 4 shows a block diagram of the device for hearing-adapted quality assessment of audio signals according to the present invention, which carries out the method according to the present invention. The method of providing a hearing-adapted quality assessment of audio signals or for objective audio signal evaluation (OASE) generates first an internal representation of an audio reference signal 12 and an audio test signal 14, respectively. To this end, the audio reference signal 12 is fed into a first bank of filters 16, which breaks down the audio reference signal to partial audio reference signals in accordance with its spectral composition. Analogously therewith, audio test signal 14 is fed into a second bank of filters 20, which in turn generates from the audio test signal 14 a plurality of partial audio test signals 22 in accordance with the spectral composition thereof. A first modelling means 24 and a second modelling means 26, respectively, for modelling the time masking models the influence of the already described masking in the time domain with respect to each partial audio reference signal 18 and each partial audio test signal 22, respectively.

It is to be noted here that the hearing-adapted quality assessment of audio signals according to the present invention can also be implemented by a single bank of filters or by a single modelling means for modelling the masking in terms of time. Just for reasons of illustration, the drawing shows means of their own for each of the audio reference signal 12 and the audio test signal 14, respectively. When a single bank of filters is used for spectral breaking down of the audio reference signal and of the audio test signal, it must be possible, for example, that the spectral composition of the audio reference signal, which has already been determined before, can be stored temporarily during processing of the audio test signal.

The partial audio reference signals 18 and the partial audio test signals 22, respectively, that have been modelled with respect to time masking are fed to an evaluation means 28 which performs detection and weighting of the results obtained, as described hereinafter. The evaluation means 28 outputs a or a plurality of model output values MAW1 . . . MAWn representing in different manners differences between the audio reference signal 12 and the audio test signal 14 derived from audio reference signal 12 by coding and decoding. As described in the following, the model output values MAW1 . . . MAWn render possible a frequency- and time-selective quality assessment of the audio test signal 14.

The internal representation of audio reference signal 12 and audio test signal 14, respectively, which constitute the basis for evaluation in evaluation means 28, correspond to the information transferred from the ear to the human brain via the auditory nerve. Due to the fact that several model output values MAW1 . . . MAWn are output, more detailed statements can be made on the qualitative and also the subjective impression than if only one single model output value were output. In particular subjective differences in weighting different artifacts thus can have a lesser disturbing effect.

Figure 5:
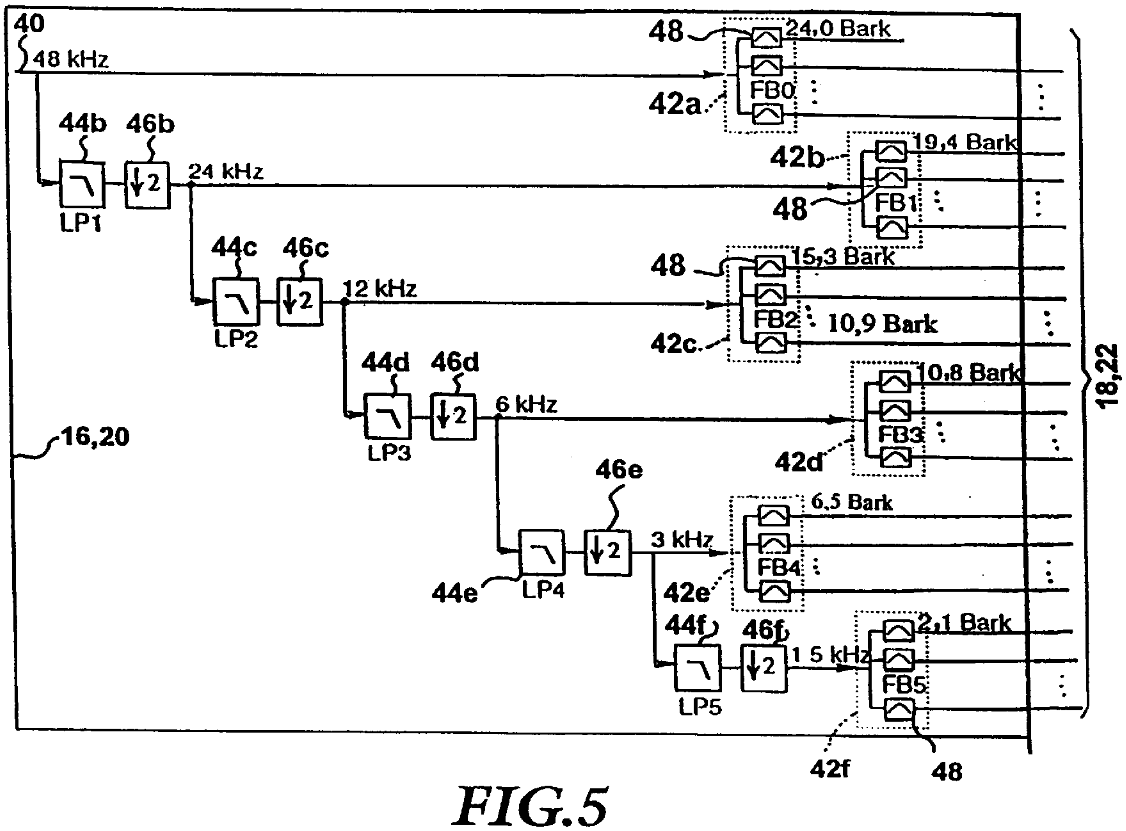

FIG. 5 shows the structure of the first bank of filters 16 and the second bank of filters 20, respectively, provided that two separate banks of filters are employed. In case only one bank of filters is employed for processing both signals in combination with temporary storing or latching, FIG. 5 shows the structure of the single bank of filters employed. Input in a signal input 40 is an audio signal to be broken down into its spectral composition, in order to obtain at the output of the bank of filters 16 and 20, respectively, a plurality of partial signals 18, 22. The bank of filters 16, 20 is subdivided into a plurality of sub-banks of filters 42*a* to 42*f*. The signal applied to signal input 40 is passed directly to the first sub-bank of filters 42*a*. In order to reach the second sub-bank of filters 42*b*, the signal is filtered by means of a first low-pass filter 44*b* and processed by means of a first decimating means 46 so that the output signal of decimating means 46*b* has a data rate of 24 kHz. Decimating means 46 thus cancels every other value of the data stream applied to signal input 40, in order to thus effectively reduce in half the calculating expenditure and the amount of data to be processed of the bank of filters. The output signal of the first decimating means 46*b* is fed to the second sub-bank of filters. In addition thereto, said signal is fed to a second low-pass filter 44*c* and a subsequent second decimating means 46*c* in order to again halve the data rate thereof. The then arising data rate is 12 kHz. The output signal of the second decimating means 46*c* in turn is fed to the third sub-bank of filters 42*c*. The input signals for the other banks of filters 42*d*, 42*e* and 42*f* are produced in similar manner, as depicted in FIG. 5. The bank of filters 16, 20 thus implements a so-called multirate structure since it has a plurality of sub-banks of filters 42*a* to 42*f* operating with a plurality ("multi") of mutually different sampling rates ("rates").

Each sub-bank of filters 42*a* to 42*b* in turn is composed of a plurality of band-pass filters 48. In a preferred embodiment of the present invention, the bank of filters 16, 20 contains 241 individual band-pass filters 48 arranged at a uniform grid pattern on the bark scale, with the center frequencies thereof differing by 0.1 bark. The unit bark is known to experts in the field of psychoacoustics and described, for example, in E. Zwicker, Psychoacoustics, publisher Springer-Verlag, Berlin Heidelberg N.Y., 1982.

Figure 9:
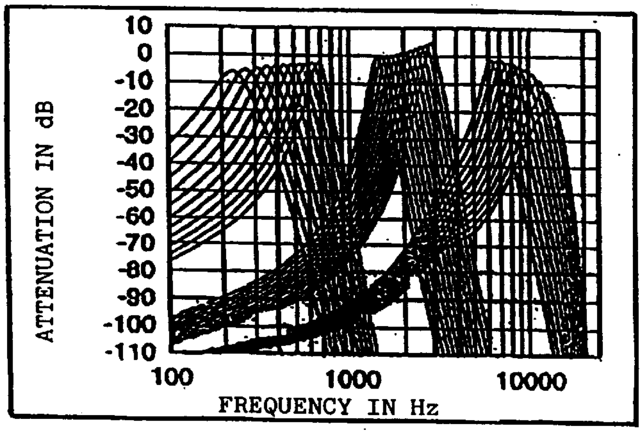
FIG. 9 shows a representation of exemplary filter curves at different sampling rates.

FIG. 9 shows some exemplary filter curves at the sampling rates 3 kHz, 12 kHz and 48 kHz. The left-hand group of filter curves in FIG. 9 corresponds to the sampling rate of 3 kHz, while the curve in the middle corresponds to a sampling rate of 12 kHz and the right-hand group applies to a sampling rate of 48 kHz.

The minimum sampling rate for each individual band-pass filter 48 in principle results from the point where its upper edge falls below the attenuation of −100 dB in FIG. 9. For reasons of simplicity, however, only the next-higher sampling rate has been selected each time for each band-pass filter 48 which fulfils the equation $f_A=2^{-n}\cdot 48$ kHz, wherein fA is the data or sampling rate of the individual band-pass filter 48 in consideration, and the index n is from 1 to 5, whereby the groups depicted in FIG. 9 result. The subdivision of the bank of filters 16, 20 into the five sub-banks of filters FB1 to FB5 results analogously therewith. All filters working with the same sampling rate can make use of a common pre-processing operation by the respective low-pass filter 44*b* to 44*f* and the respective decimating means 46*b* to 46*f*. The creation of the individual filter excitation curves or filter functions, respectively, will be illustrated in detail in the following.

All band-pass filters 48 shown in FIG. 5, in a preferred embodiment, are realized by means of digital FIR filters, each of these FIR filters having 128 filter coefficients that can be calculated in a manner known among experts when the filter curve or the filter function, respectively, is known. This can be achieved by rapid convolution, and in doing so all filters from FBO (42*a*) and LP1 (44*b*) (LP=Low Pass) commonly can make use of an FFT for calculating the filters. The limit frequencies of the low-pass filters 44*b* to 44*f* have to be selected such that, together with the sampling rate relevant for the respective sub-bank of filters, no violation of the sampling theorem is caused.

It is to be noted here that the output signal 1, 2, . . . , 241 of each filter, i.e. a partial test signal and partial reference signal, respectively, has a bandwidth defined by the corresponding filter that has generated the partial signal. This bandwidth of a single filter is also referred to as spectral region. The center frequency of a spectral region thus corresponds to the center frequency of the corresponding band filter, whereas the bandwidth of a spectral region is equal to the bandwidth of the corresponding filter. It is thus obvious that the individual spectral regions or band filter bandwidths, respectively, overlap, since the spectral regions are wider than 0.05 bark. (0.1 bark is the distance of the center frequency of a band filter to the next band filter.)

Figure 6:
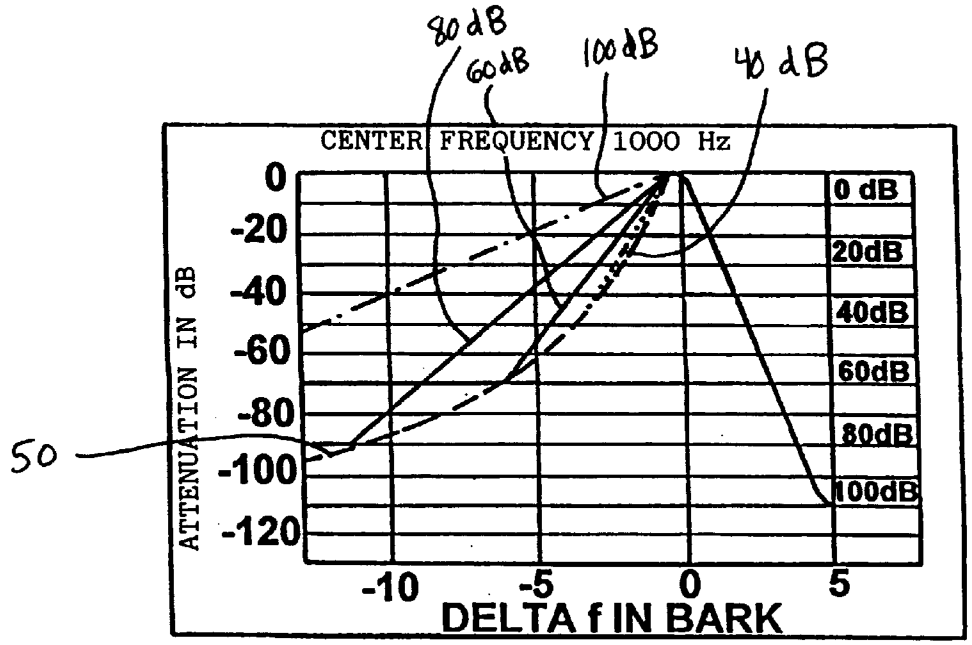
FIG. 6 shows an exemplary representation to illustrate the construction of a masking filter.

FIG. 6 shows in exemplary manner the construction of a masking filter 48 on the band-pass filter having the center frequency $f_m$ of 1,000 Hz. Shown along the ordinate in FIG. 6 is the filter attenuation in dB, while the abscissa depicts the frequency deviation to the left and to the right, respectively, from the center frequency $f_m$ in bark. The parameter in FIG. 6 is the sound pressure level of an audio signal filtered by the filter. The sound pressure level of the filtered audio signal may have an extension from 0 dB to 100 dB. As was already mentioned, the filter configuration of band filter of the human ear, as seen as a model, is dependent upon the sound pressure level of the audio signal received. As can be seen in FIG. 6, the left-hand filter edge is relatively flat with high sound pressure levels and becomes steeper towards lower sound pressure levels. In contrast thereto, the steeper edge changes more quickly to the resting threshold in case of lower sound pressure levels, which in FIG. 6 are the straight continuations of the individual exemplary filter edges.

The dependency on the sound pressure level of the audio signal could be achieved by switching over between various coefficients of the digital band filters 48 of the bank of filters. However, in addition to very high complexity, this would also entail the disadvantage that the method would become very susceptible to changes in listening loudness. (See Kh. Brandenburg and Th. Sporer. "NMR" and "Masking Flag": Evaluation of quality using perceptual criteria. In *Proceedings of the* 11*th International Conference of the AES,* Portland, 1992.)

The hearing-adapted quality assessment of audio signals according to the present invention therefore has chosen a different approach. On the basis of the filter curves that would result for different sound pressure levels, a curve 50 is formed for the worst masking case or worst case. The worst case curve 50 results in case of a specific frequency deviation from center frequency $f_m$ from the minimum value of all sound pressure level curves in a specific nominal sound pressure level range, which may extend, for example, from 0 dB to 100 dB. The worst case curve thus has a steep edge close to the center frequency and becomes flatter with increasing distance from the center frequency, as illustrated by curve 50 in FIG. 6. As can also be seen from FIG. 6, the filter edge of a band-pass filter 48 on the right-hand side with respect to the center frequency $f_m$, apart from the resting threshold, is dependent only little on the sound pressure level of the filtered audio signal. This means that the inclinations of the curve edges on the right-hand side are nearly the same from a sound pressure level of 0 dB to a sound pressure level of 100 dB.

Figure 7:
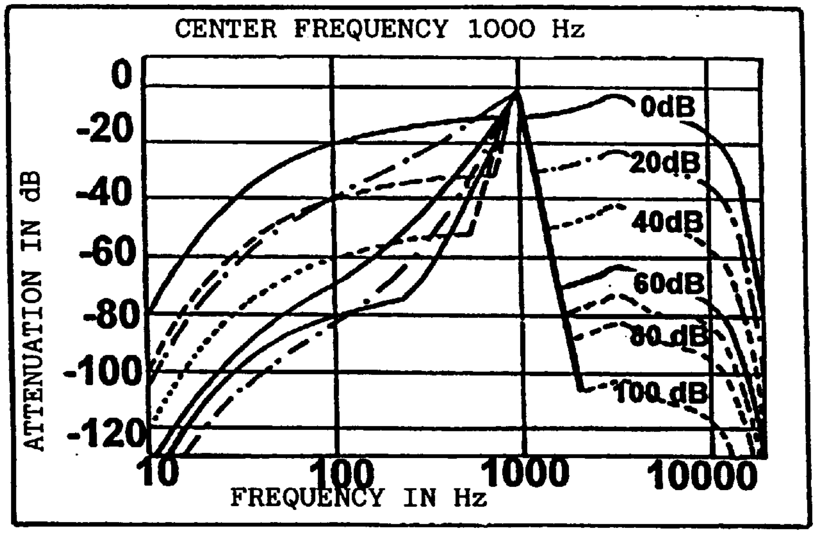
FIG. 7 shows a representation to illustrate the construction of a masking filter in consideration of the external and middle ear transmission function and of the internal noise.

In the hearing-adapted quality assessment of audio signals according to the present invention, the influence of the transmission function of the external ear and the middle ear, and of internal noise caused, for example, by the blood flow in the ear is taken into consideration in addition. The curves resulting therefrom for individual sound pressure levels from 0 dB to 100 dB are depicted in FIG. 7. In contrast to FIG. 6, FIG. 7 depicts along the abscissa the spectral range in Hz instead of the frequency scale in bark, which is also referred to as tonality scale. Expressed in mathematical terms, the external and middle ear transmission function and the internal noise of the ear can be modelled by the following equation:

$$\frac{a_0(f)}{\text{dB}} = -6.5 \cdot e^{-0.6\left(\frac{f}{1000\,\text{Hz}}-3.3\right)^2} + 1.82\left(\frac{f}{1000\,\text{Hz}}\right)^{-0.8} + 0.5 \cdot 10^{-3}\left(\frac{f}{1000\,\text{Hz}}\right)^4$$

The parameter $a_0(f)$ constitutes the attenuation of the ear over the entire frequency range and is indicated in dB.

The masking curves or filter curves for the individual band-pass filters 48 can be modelled by the following mathematical equation as a function of the center frequency $f_m$ and as a function of the sound pressure level L:

$$\frac{A(\Delta b, f_m, L)}{\text{dB}} = A_0(f_m, L) + \frac{S_1 - S_2(f_m, L)}{2} \cdot \left(\frac{\Delta b}{Bark} + C_1(f_m, L)\right) - \frac{S_1 + S_2(f_m, L)}{2}\sqrt{C_2 + \left(\frac{\Delta b}{Bark} + C_1(f_m, L)\right)^2}$$

The individual parameters used in the equation are listed hereinafter:

$f_m$=center frequency of a band-pass filter;

$\Delta b$=frequency difference in bark between the center frequency

L=sound pressure level of the filtered audio signal;

rounding factor $C_2=0.1$;

steepness of the lower edge $S_1=27$ (dB/bark);

steepness of the upper edge: $S_2(f_m,L)=24+230\ \text{Hz}/f_m-0.2\cdot L/\text{dB}$;

constant $C_1$:

$$C_1(f_m,L)=(S_1-S_2(f_m,L)/2\cdot\sqrt{C_2/(S_1\cdot S_2(f_m,L))};$$

constant $$A_0(f_m,L)=\sqrt{C_2\cdot S_1\cdot S_2(f_m,L)}.$$

The conversion equation from the frequency scale in hertz to the frequency scale in bark reads as follows:

$$\frac{\text{Hz2}Bark(f)}{Bark} = 13 \cdot \arctan\left(0.76\frac{f}{1000\,\text{Hz}}\right) + 3.5 \cdot \arctan\left(\left(\frac{f}{7500\,\text{Hz}}\right)^2\right)$$

When a virtual resting threshold at −10 dB is integrated in a addition in masking curve A, a limit masking curve Alim results, which is defined as follows:

$$A_{lim}(\Delta b,f_m,L)=\max(A(\Delta b,f_m,L),-L-10\ \text{dB})$$

The transition from the bark scale to the hertz scale for the masking curve inclusive of the virtual resting threshold together with the inclusion of the external and middle ear transmission function $A_0(f)$ provides the extended limit masking curve $A_{lim}$, which in addition is a function of the sound pressure level of the audio signal:

$$\hat{A}_{lim}(f,f_m,L)=A_{lim}(\text{Hz2 bark}(f_m)-\text{Hz2 bark}(f),f_m,L)-a_0(f)$$

As was already mentioned, too much expenditure is involved for selecting for each sound pressure level a filter curve or masking curve of its own, and this is why a worst case curve is calculated. The worst case curve $A_{wc}(f, f_m)$ indicates the finally employed attenuation of a filter with the center frequency $f_m$ at the actual frequency f in Hz. The mathematical expression of the worst case curve $A_{wc}$ reads as follows:

$$A_{wc}(f,f_m)=\min(\hat{A}_{lim}(f,f_m,L);\ -3\ \text{dB} \leqq L \leqq 120\ \text{dB})$$

Figure 8:
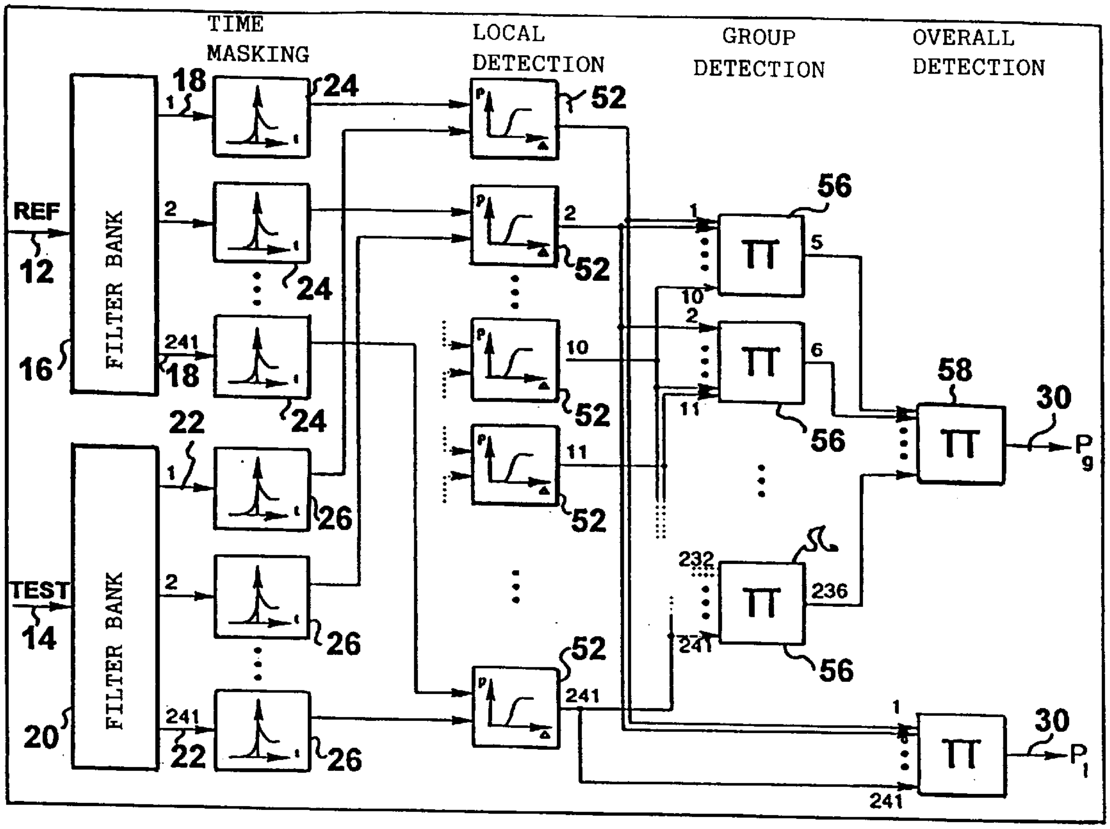
FIG. 8 shows a detailed block diagram of the device for hearing-adapted quality assessment of audio signals according to the present invention.

FIG. 8 illustrates a block diagram of the device and the method, respectively, for performing a hearing-adapted quality assessment of audio signals according to the present invention. As was already described in conjunction with FIG. 5, the audio reference signal 12 is fed to the bank of filters 16 in order to produce partial audio reference signals 18. Analogously therewith, the audio test signal 14 is fed to the bank of filters 20 in order to produce partial audio test signals 22. It is to be remarked here that it can be seen from FIG. 6 and FIG. 7 that the individual filter curves of the band-pass filters 48 overlap each other since the center frequencies of the individual filters are spaced apart only by 0.1 bark each. Each band-pass filter 48 thus is supposed to model the excitation of a hair cell on the basilar membrane of the human ear.

The output signals of the individual band-pass filters of the bank of filters 16 and the bank of filters 20, respectively, which on the one hand are the partial audio reference signals 18 and the partial audio test signals 22, respectively, are fed to respective modelling means 24 and 26, respectively, which are supposed to model the time masking described at the beginning. The modelling means 24, 26 serve for modelling the resting threshold and post-masking. The output values of the bank of filters are squared, and a constant value for the resting threshold is added thereto, since the frequency dependency of the resting threshold has already been considered in the bank of filters, as was elucidated hereinbefore. A recursive filter with a time constant of 3 ms smoothes the output signal. This is followed by a non-linear filter which on the one hand as integrator integrates the energy accumulating over the duration of a sound event and which on the other hand models the exponential decline of the excitation after the end of a sound event. Details of the structure of the modelling means 24 and 26 are described in M. Krajalainen, A new auditory model for the evaluation of sound quality of audio system, *Proceedings of the ICASSP*, pages 608 to 611, Tampa, Fla., March 1985, IEEE. It is to be pointed out that this modelling of the time masking reduces the bandwidth in all filter bands for all band-pass filters 48 to such an extent that a further undersampling step is possible through which all bands can be brought to the same sampling rate of 1.5 kHz.

Figure 10:
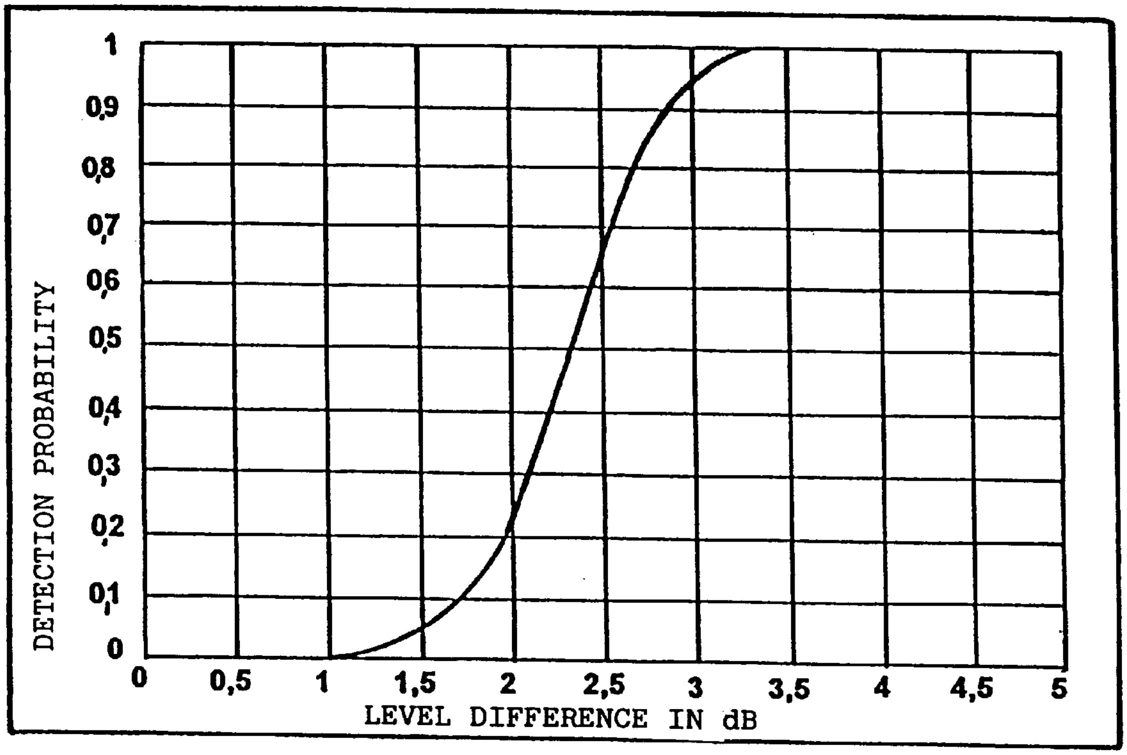
FIG. 10 shows a representation of the threshold function for mapping level differences in a spectral region on the detection probability.

The output signals of modelling means 24, 26 thereafter are fed to detection calculating means 52 the function of which will be explained in the following. As shown in FIG. 8, the detection calculating means 52 for the first band-pass filter numbered 1 is fed with the partial audio reference signal output from band-pass filter numbered 1, and with the partial audio test signal output from band-pass filter No. 1 of the bank of filters for the audio test signal. The detection calculating means 52 on the one hand establishes a difference between these two levels and on the other hand maps the level difference between the partial audio reference signal and the partial audio test signal in the form of a detection probability. The excitations in filter bands 48 with the same center frequency $f_m$ arising from the audio reference signal and the audio test signal thus are subtracted and compared with a threshold function which is illustrated in FIG. 10. This threshold function shown in FIG. 10 maps the absolute value of the difference in dB on a so-called "local detection probability". The detection threshold proper for the human brain is 2.3 dB. It is, however, important to note here that a certain uncertainty of detection is present around the detection threshold proper of 2.3 dB, and this is why the probablility curve shown in FIG. 10 is utilized. A level difference of 2.3 dB is mapped on a detection probability of 0.5. The individual detection calculating means 52, which are associated with band-pass filters 48 each, all operate in parallel with each other, and furthermore, they map each level difference in time-serial manner in a detection probability $P_{i,t}$.

It should be noted here that the hearing-adapted quality assessment of audio signals operates in the time domain, with the time-discrete input signals of audio reference signal 12 and of audio test signal 14 being processed sequentially by means of digital filters in the bank of filters. It is thus obvious that the input signals for the detection calculating means 52 also are a serial data stream in terms of time. The output signals of the detection calculating means 52 thus also are serial data streams in terms of time which represent the detection probability for each frequency range of the corresponding band-pass filter 48 at each moment of time or each time slot, respectively. A low detection probability of a specific detection calculating means 52 in a specific time slot allows the assessment that the audio test signal 14 derived from audio reference signal 12 by coding and decoding has a coding error in the specific frequency range and at the specific moment of time, with said error being probably not sensed by the brain. In contrast thereto, a high detection probability points out that the human brain probably will detect a coding or decoding error, respectively, of the audio test signal, since the audio test signal has an audible defect in the specific time slot and in the specific frequency range.

Figure 11:
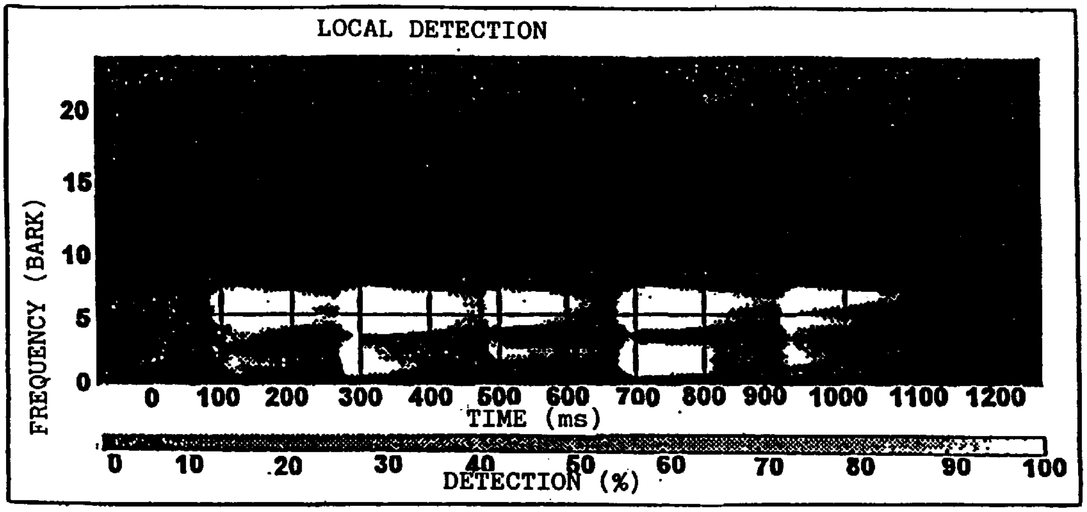
FIG. 11 shows a graphical representation of the local detection probability of an exemplary audio test signal.
Figure 12:
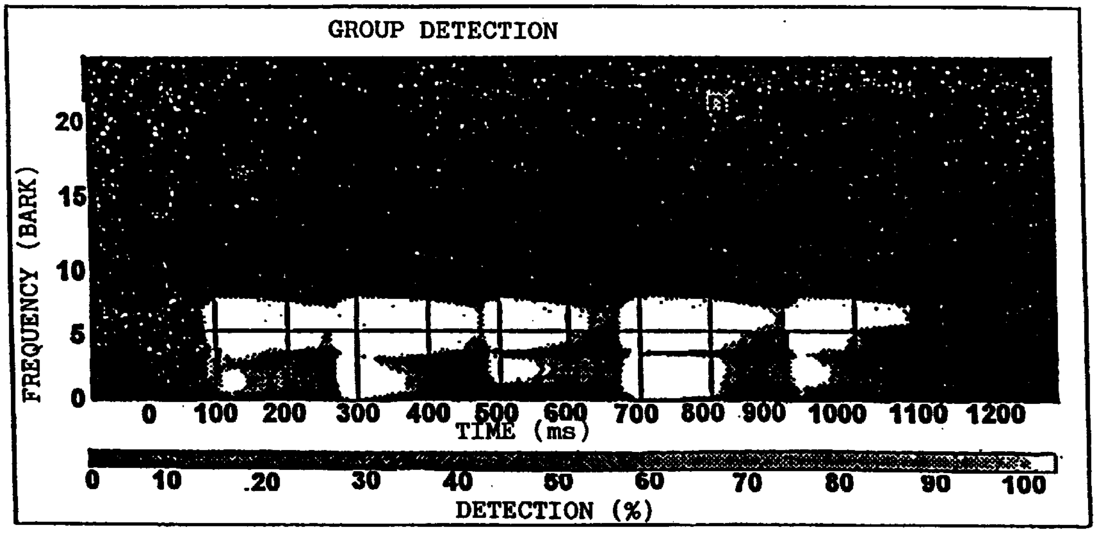
FIG. 12 shows a graphical representation of the frequency group detection probability of the exemplary audio test signal used in FIG. 11.

The output signals of the detection calculating means 52 selectively may be fed to an overall detection mean 54 or to a plurality of group detection means 56. The overall detection means 54, in contrast, issues an overall detection probability which is shown in FIG. 11 for a specific, internationally employed test signal. The upper diagram of FIG. 11 shows along the ordinate the frequency in bark, whereas the abscissa indicates the time in ms. In the lower diagram, a specific detection probability in percent is associated with a specific shading of the upper diagram. White areas in the upper diagram represent coding and decoding errors, respectively, that can be ascertained by the brain by one hundred percent. The reference signal employed is known in the art and is located on track 10 of the CD SQAM (SQAM=Sound Quality Assessment Material) and is designated SQAM, Track 10. From this is obtained an audio signal containing purposefully a coding or decoding error, respectively, said audio signal resulting when a twice-accented a is played on a violoncello and is purposefully wrongly coded and decoded. The length thereof is 2.7 seconds, with FIG. 11 and also FIG. 12 graphically illustrating, however, just the first 1.2 seconds of the exemplary signal.

The group detection means 56 operate as follows. From the detection probabilities $P_{i,t}$ supplied to them, they form at first the counter-probabilities $pg_{i,t}=1-P_{i,t}$ of a time slot t. The counter-probability pg is a measure that no disturbance can be detected in a time slot t. When the counter-probabilities of the level differences of several band-pass filters, are multiplied with each other as indicated by the product symbol in FIG. 8, the counter-probability of the counter-probability created by the formation of the product in turn provides the overall detection probability of the time slot when the output signals of the detection calculating means 52 are all fed to the overall detection means 54, as shown in FIG. 8. When this detection probability is averaged in time, the average overall detection probability is obtained. An exacter statement concerning the quality of the audio test signal, however, is offered by a histogram which indicates in how many per cent of the time slots the overall detection probability is greater than 10%, 20%, . . . , 90%.

As was already mentioned, FIG. 11 shows the local detection probability when the output signals of the detection calculating means directly are represented graphically. It can be seen clearly that in the lower frequency range approx. below 5 bark (approx. 530 Hz) and above 2 bark (200 Hz) coding and decoding errors, respectively, of the audio test signal in the time range from about 100 ms to 1,100 ms will be detected by the brain with very great probability. In addition thereto, a brief disturbance is visible at 22 bark.

The disturbances become more evident in the graphical representation when, instead of the local detection probability constituted by the outputs of the detection calculating means 52, a frequency group detection probability is selected which is calculated by the group detection means 56. The group detection probability constitutes a measure to the effect that a disturbance is perceivable around a filter k in the range comprising a frequency group.

In a preferred embodiment of the present invention, ten adjacent local detection probabilities each are combined. Due to the fact that ten adjacent band-pass filters are spaced apart by 0.1 bark each, the combined grouping of ten adjacent detection probabilities corresponds to a frequency range of 1 bark. It is appropriate to select the combined grouping of adjacent detection probabilities in such a manner that frequency ranges results which substantially coincide with the psychoacoustic frequency groups. This permits in advantageous manner a simulation of the frequency group formation of the human ear, so as to be able to also graphically represent a rather subjective acoustic impression of disturbances. It is gatherable from a comparison of FIG. 12 to FIG. 11 that a groupwise combination of the detection probabilities reveals that also with higher frequencies than those of FIG. 11, coding and decoding errors, respectively, of the audio test signal probably can be heard as well. The group detection shown in FIG. 12, thus, delivers a more realistic quality assessment of audio signals than the local detection in FIG. 11, since it employs a simulation of the frequency group formation in the human ear. The difference of adjacent filter output values (with the differences being selected to be smaller than or equal to a frequency group), thus are evaluated jointly and provide a measure for the subjective disturbance in the corresponding frequency range.

As an alternative, the frequency axis can be subdivided into three sections (below 200 Hz, 200 Hz to 6,500 Hz, above 6,500 Hz). The levels of the audio reference signal and of the audio test signal, respectively, also can be subdivided into three sections (silence; low: up to 20 dB; loud: beyond 20 dB). Thus, nine different types result to which a filter sampling value may belong. Time sections in which all filter output values of both input signals belong to the type silence need not be considered in more detail. From the remaining six, measures for the detection probability of the difference between the input signals are determined for each time slot, as mentioned hereinbefore. In addition to the determination of the detection probability, it is also possible to define a so-called disturbance loudness which is also correlated with the level difference calculated by the detection calculating means 52, and which indicates the intensity to which a defect will be disturbing. Thereafter, separate average values of the disturbance loudness and of the detection probability are calculated for each one of the six types.

Furthermore, short-time average values are calculated over a period of time of 10 ms, with the 30 worst short-time average values of a complete audio signal being stored. The average values in turn of these 30 worst case values as well as the overall average value together yield the acoustic impression. It is to be pointed out in this respect that worse case values make sense when disturbances are distributed very unevenly. In contrast thereto, overall average values make sense when there are often small, but audible disturbances. The decision whether the overall average values or the worst case values should be employed for assessing the audio test signal, can be taken via an extreme-value linkage of these two assessment values.

The hearing-adapted quality assessment of audio signals described so far has referred to monaural or mono audio signals. The hearing-adapted quality assessment of audio signals according to the present invention, however, also permits an assessment of binaural or stereophonic audio test signals by non-linear pre-processing between the bank of filters 16 and 20, respectively, and the detection in the detection calculating means 52. As known to experts, stereophonic audio signals have a left-hand and a right-hand channel each. The left-hand and right-hand channels of the audio test signal and of the audio reference signal, respectively, are each filtered separately by means of a non-linear element that emphasizes transients in frequency-selective manner and reduces stationary signals. The output signal of this operation will be referred to in the following as modified audio test signal and modified audio reference signal, respectively. The detection in detection calculating means 52 now is no longer carried out once, as described hereinbefore, but four times, with successive input signals being fed in alternating manner to the detection calculating means 52:

first detection, left-hand channel (D1L): left-hand channel of audio reference signal with left-hand channel of audio test signal;

first detection, right-hand channel (D1R): right-hand channel of audio reference signal with right-hand channel of audio test signal;

second detection, left-hand channel (D2L): left-hand channel of modified audio reference signal with left-hand channel of modified audio test signal; and second detection, right-hand channel (D2R): right-hand channel of modified audio reference signal with right-hand channel of modified audio test signal.

Only the worst case value is determined from each of the detections D1L and D1R as well as D2L and D2R, respectively, whereafter the thus created values are combined via a weighted average value in order to assess the quality of the stereophonic audio test signal.

What is claimed is:

1. A method of performing a hearing-adapted quality assessment of an audio test signal derived from an audio reference signal by coding and decoding, comprising the following steps:

breaking down the audio test signal in accordance with its spectral composition into partial audio test signals by means of a first bank of filters consisting of filters overlapping in frequency and defining spectral regions, said filters having differing filter functions which are each determined on the basis of the excitation curves of the human ear at the respective filter center frequency, with an excitation curve of the human ear at a filter center frequency being dependent upon the sound pressure level of an audio signal supplied to the ear;

breaking down the audio reference signal in accordance with its spectral composition into partial audio reference signals by means of the first bank of filters or a second bank of filters coinciding with the first bank of filters;

forming the level difference, by spectral regions, between the partial audio test signals and the partial audio reference signals belonging to the same spectral regions; and determining, by spectral regions, a detection probability for detecting a coding error of the audio test signal in the particular spectral region on the basis of the respective level difference, the detection probability simulating the probability that a level difference between a partial audio reference signal and a partial audio test signal is sensed by the human brain.

2. The method of claim 1, wherein the excitation curve takes into consideration an external and middle ear transmission function and internal noise of the human ear.

3. The method of claim 1, wherein the excitation curves of the filters of the first and second banks of filters are determined in accordance with the center frequency of the filters in order to provide an approximation to the frequency resolution of the human ear that decreases in the direction towards high frequencies.

4. The method of claim 1, wherein the excitation curves of the filters of the first and second banks of filters are determined in accordance with the sound pressure level of the audio test signal and the audio reference signal, respectively, so as to have flatter filter edges and lower resting thresholds at higher sound pressure levels than at lower sound pressure levels.

5. The method of claim 1, wherein the excitation curves of the filters of the first and second banks of filters are determined in accordance with the sound pressure level of the audio test signal and the audio reference signal, respectively, so that one filter function each is formed from minimum attenuation values of all filter functions possible in a sound pressure level range and corresponding to a specific sound pressure level.

6. The method of claim 1, which prior to the step of forming the level difference by spectral regions comprises the steps of modelling, by spectral regions, the time masking of the audio test signal and the audio reference signal.

7. The method of claim 6, wherein the step of modelling, by spectral regions, the time masking comprises integration, by spectral regions, of an audio reference signal or an audio test signal in order to take into consideration pre-masking, as well as an exponential attenuation, by spectral regions, of the audio reference signal or the audio test signal in order to take into consideration post-masking.

8. The method of claim 1, wherein the filters of the first and second banks of filters have different sampling rates, the sampling rate being determined by the intersection of the filter edge located in terms of frequency above the center frequency of a filter, with a predetermined filter attenuation.

9. The method of claim 8, wherein the step of breaking down comprises the following step:

grouping adjacent filters in the form of sub-banks of filters having the same sampling rates which are determined by the quotient of the original sampling rate, with which the audio test signal and the audio reference signal have been discretized, and a power of 2.

10. The method of claim 1, wherein prior to the step of forming the level difference by spectral regions, a delay between the audio reference signal and the audio test signal is determined and compensated.

11. The method of claim 1, wherein the step of determining the detection probability by spectral regions comprises the following partial steps:

allocating a detection probability of 0.5 to a specific threshold level difference;

allocating a detection probability which is smaller than 0.5 to a level difference that is smaller than the specific threshold level difference; and allocating a detection probability which is greater than 0.5 to a level difference that is greater than the specific threshold level difference.

12. The method of claim 1, wherein the detection probabilities of adjacent spectral regions in a spectral range smaller than or equal to a psychoacoustic frequency group, are evaluated jointly thereby achieving a subjective sensation of the coding error of the audio test signal.

13. The method of claim 1, wherein several successive detection probabilities in time are combined to form a time slot, and the several successive detection probabilities in time are linked so as to obtain an overall detection probability for a time slot.

14. The method of claim 1, wherein short-time average values of the detection probabilities in a spectral region are formed, and a number of short-time average values of an audio test signal is stored, with an overall average value of all short-time average values together with the stored short-time average values yielding an overall acoustic impression of the respective spectral region of the audio test signal.

15. The method of claim 1, wherein the audio test signal and the audio reference signal are stereo signals having a left-hand and a right-hand channel;

wherein the steps of breaking down the audio test signal and the audio reference signal comprise the separate breaking down of the left-hand channel and the right-hand channel of the signals by means of a non-linear element that emphasizes transients and reduces stationary signals, so as to produce a modified audio test signal having a left-hand channel and a right-hand channel as well as a modified audio reference signal having a left-hand channel and a right-hand channel; and wherein the formation of the level difference by spectral regions comprises the formation of the level difference between the partial signals belonging to the same spectral regions, namely the partial audio test signals of the left-hand channel and the partial audio reference signals of the left-hand channel, the partial audio test signals of the right-hand channel and the partial audio reference signals of the right-hand channel, the modified partial audio test signals of the left-hand channel and the modified partial audio reference signals of the left-hand channel, and the modified partial audio test signals of the right-hand channel and the modified partial audio reference signals of the right-hand channel.

16. The method of claim 15, wherein the greatest level difference is determined, by spectral regions, from the level differences of the signals for the left-hand channel and for the right-hand channel;

wherein the greatest level difference is determined, by spectral regions, from the level differences of the modified signals for the left-hand channel and for the right-hand channel; and wherein the greatest level difference for the audio test signal and the greatest level difference for the modified audio test signal are combined via a weighted average value in order to detect the coding error of the stereophonic audio test signal.

17. The method of claim 1, wherein the first and second banks of filters are constituted by one single bank of filters, and wherein, during breaking down of the audio test signal or the audio reference signal, the partial audio reference signals and the partial audio test signals, respectively, are stored temporarily.

18. A device for performing a hearing-adapted quality assessment of an audio test signal derived from an audio reference signal by coding and decoding, comprising:

a first bank of filters for breaking down the audio test signal in accordance with its spectral composition into partial audio test signals, said first bank of filters including filters overlapping in frequency and defining spectral regions and having differing filter functions which are each determined on the basis of the excitation curves of the human ear at the respective filter center frequency, with an excitation curve of the human ear at a filter center frequency being dependent upon the sound pressure level of an audio signal supplied to the ear;

a second bank of filters coinciding with the first bank of filters, for breaking down the audio reference signal in accordance with its spectral composition into partial audio reference signals;

a calculating device for forming the level difference, by spectral regions, between the partial audio test signals and the partial audio reference signals belonging to the same spectral regions; and an allocation device for determining, by spectral regions, a detection probability for detecting a coding error of the audio test signal in the particular spectral region on the basis of the respective level difference, the detection probability simulating the probability that a level difference between a partial audio referene signal and a partial audio test signal is sensed by the human brain.

19. The device of claim 18, comprising furthermore a modelling device for modelling, by spectral regions, the time masking of the audio test signal and the audio reference signal.

20. The device of claim 19, wherein the modelling device comprises an integration device for integrating, by spectral regions, a partial audio reference signal or a partial audio test signal in order to take into consideration pre-masking, as well as an attenuation device for exponentially attenuating, by spectral regions, the partial audio reference signal or the partial audio test signal in order to take into consideration post-masking.

21. The device of claim 18, comprising furthermore a plurality of group evaluation devices for commonly evaluating adjacent spectral regions for achieving a subjective sensation of the coding error of the audio test signal, with the number of adjacent, commonly evaluated spectral regions being selected such that a bandwidth formed by the commonly evaluated spectral regions is smaller than or equal to a psychoacoustic frequency group.

22. The device of claim 18, comprising furthermore an overall evaluation device for commonly evaluating all spectral regions in order to achieve an overall representation of the coding error of the audio test signal.

23. A device for performing a hearing-adapted quality assessment of an audio test signal derived from an audio reference signal by coding and decoding, comprising:

a bank of filters for breaking down the audio test signal in accordance with its spectral composition into partial audio test signals and for breaking down the audio reference signal in accordance with its spectral composition into partial audio reference signals, said bank of filters including filters overlapping in frequency and defining spectral regions and having differing filter functions which are each determined on the basis of the excitation curves of the human ear at the respective filter center frequency, with an excitation curve of the human ear at a filter center frequency being dependent upon the sound pressure level of an audio signal supplied to the ear;

a memory for temporarily storing the spectral composition of the audio test signal while the audio reference signal is processed, or for temporarily storing the spectral composition of the audio reference signal while the audio test signal is processed;

a calculating device for forming the level difference, by spectral regions, between the partial audio test signals and the partial audio reference signals belonging to the same spectral regions; and an allocation device for determining, by spectral regions, a detection probability for detecting a coding error of the audio test signal in the particular spectral region on the basis of the respective level difference, the detection probability simulating the probability that a level difference between a partial audio referene signal and a partial audio test signal is sensed by the human brain.

* * * * *